United States Patent [19]
Ishihara et al.

[11] Patent Number: 5,801,445
[45] Date of Patent: Sep. 1, 1998

[54] SEMICONDUCTOR DEVICE AND METHOD OF MANUFACTURING SAME

[75] Inventors: Yasuo Ishihara, Kariya; Haruo Kawakita, Okazaki; Naoto Okabe, Chita, all of Japan

[73] Assignee: Denso Corporation, Kariya, Japan

[21] Appl. No.: 818,729

[22] Filed: Mar. 14, 1997

[30] Foreign Application Priority Data

Mar. 15, 1996 [JP] Japan ................... 8-058783

[51] Int. Cl.⁶ .......... H01L 23/48; H01L 23/52; H01L 29/40; H01L 29/76
[52] U.S. Cl. .......... 257/771; 257/688; 257/288; 257/316; 257/319
[58] Field of Search .............. 257/771, 288, 257/316, 318, 337, 319; 438/688

[56] References Cited

U.S. PATENT DOCUMENTS

| | | | |
|---|---|---|---|
| 4,546,374 | 10/1985 | Olsen et al. | 257/776 |
| 4,558,345 | 12/1985 | Dwyer et al. | 257/786 |
| 4,984,061 | 1/1991 | Matsumoto | 257/772 |
| 5,229,646 | 7/1993 | Tsumura | 257/782 |
| 5,481,137 | 1/1996 | Harada et al. | 257/771 |

FOREIGN PATENT DOCUMENTS

| | | | |
|---|---|---|---|
| 60-95947 | 5/1985 | Japan | 257/771 |
| 7-240432 | 9/1995 | Japan | . |
| 8-45874 | 2/1996 | Japan | . |

OTHER PUBLICATIONS

Silicon Precipitate Nodule–Induced Failures of MOSFETS, M. Johnson et al. Motorola, Inc., At Istfa '91: The 17th. International Symposium for Testing & Failure Analysis, 11–15 /Nov./ 1991 LA, California, USA. pp. 161–165.

*Primary Examiner*—Mahshid D. Saadat
*Assistant Examiner*—Jhihan B. Clark
*Attorney, Agent, or Firm*—Cushman Darby & Cushman IP Group of Pillsbury Madison & Sutro LLP

[57] ABSTRACT

A semiconductor device has an electrode interposed between an interlayer insulation film and a wire which is bonded thereto. A main component of the electrode is aluminum and the electrode contains fine-grained silicon in a concentration of 0.1 to 0.6 weight %. As a result, even if large ultrasonic power, a large load or the like is applied to the electrode when the wire is wire-bonded, damage such as the formation of a crack hardly generates at the interlayer insulation film. Therefore, the occurrence of defects due to the wire-bonding can be reduced.

10 Claims, 9 Drawing Sheets

SEMICONDUCTOR DEVICE AND METHOD OF MANUFACTURING SAME

CROSS REFERENCE TO RELATED APPLICATION

This application is based upon and claims priority from Japanese Patent Application No. Hei. 8-58783 filed Mar. 15, 1996, the contents of which are incorporated herein by reference.

BACKGROUND OF THE INVENTION

1. Field of the Invention

The present invention relates to a semiconductor device having an electrode made of a metallic material containing fine-grained silicon (hereinafter, referred to as fine-grained Si) on an interlayer insulation film formed on a semiconductor substrate and a method of manufacturing the same.

2. Related Art

Figure 20:
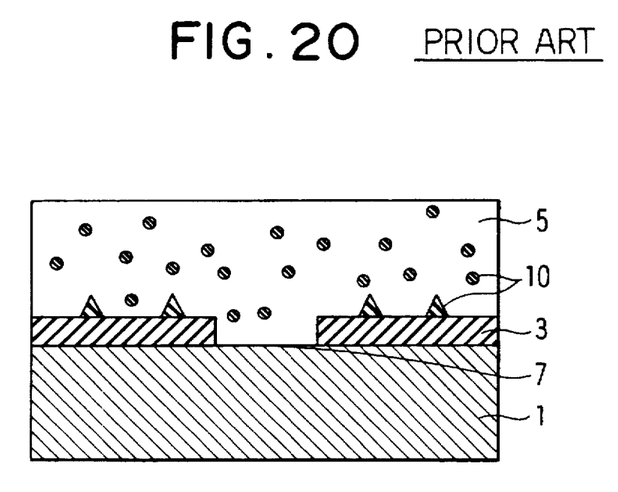
FIG. 20 is a partly sectional schematic view of a conventional semiconductor device.

An integrated circuit (hereinafter, referred to as an IC chip) has previously been made with elements such as resistors, transistors and capacitors formed on a semiconductor substrate 1 as shown in FIG. 20. An interlayer insulation film 3 is formed on the elements to protect the elements as well as to insulate the elements. Further, an electrode 5 which is a thin film of metallic material such as aluminum (Al) is formed on the interlayer insulation film 3 to electrically connect the IC chip and an outside circuit.

Figure 19:
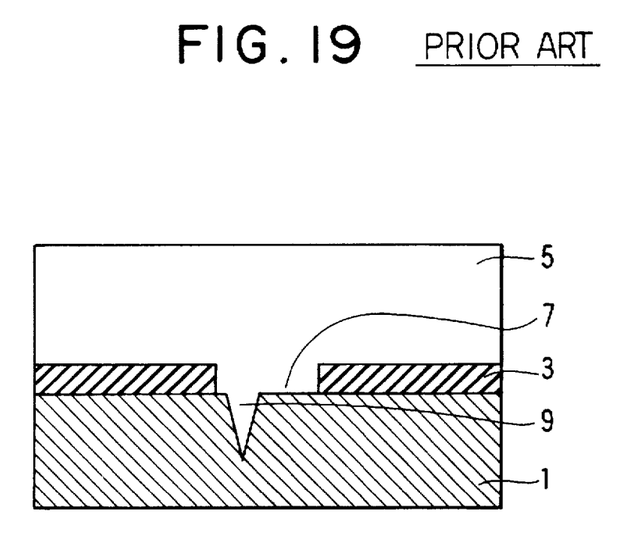
FIG. 19 is a partly sectional schematic view to explain an occurrence mechanism of a defective device.

When a thin film of aluminum which does not contain impurities, i.e., a thin film of pure aluminum is used as an electrode 5, as shown in FIG. 19, a projecting portion of aluminum into the semiconductor substrate 1, which is known as an alloy spike 9, is generated as a result of silicon dissolving in aluminum at a contact portion where silicon constituting the semiconductor substrate 1 directly contacts with aluminum of the electrode 5. If the alloy spike 9 is generated in the semiconductor substrate 1, the alloy spike 9 destroys a PN junction in the substrate 1. As a result, characteristics of the semiconductor device are greatly affected by the alloy spike 9.

Therefore, a conventional IC chip prevents the alloy spike from generating by using as an electrode 5 an Al—Si alloy in which the silicon content ratio of the Al—Si alloy is in a range of 1 to 2 weight %.

However, because the electrode 5 contains a great amount of silicon, fine-grained Si 10 inevitably separates at grain boundaries of aluminum and the like as shown in FIG. 20. This will be explained in more detail with reference to FIG. 21.

Figure 21:
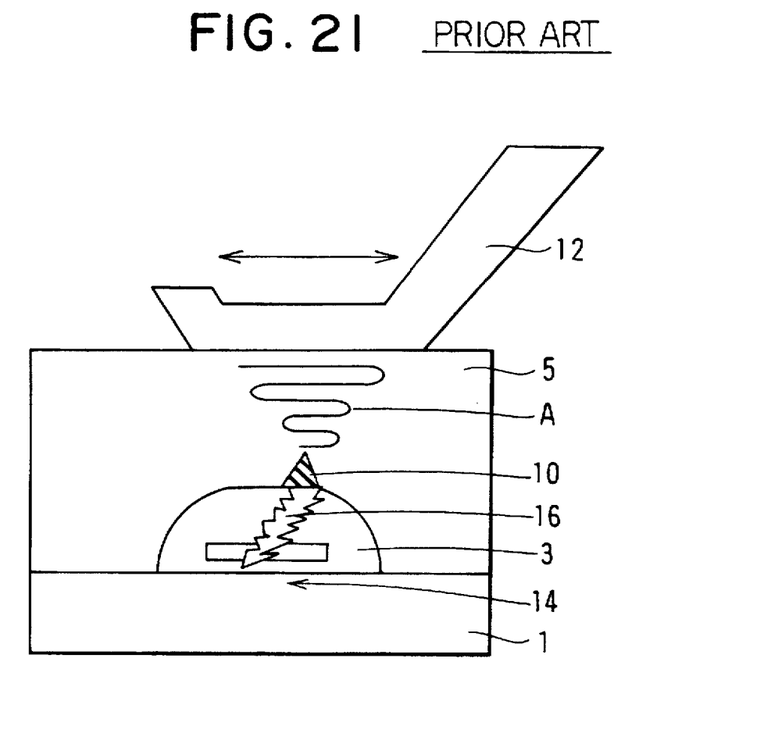
FIG. 21 is a schematic view to explain a problem occurring in a process of making the conventional semiconductor device.

In FIG. 21, when an aluminum wire 12 is ultrasonic-bonded to the semiconductor device, the aluminum wire 12 is wire-bonded on the electrode 5. If the wire-bonding of the aluminum wire 12 is performed over a transistor cell 14, the fine-grained Si separated on an interlayer insulation film 3 form a crack 16 in the interlayer insulation film 3 by receiving vibration energy A in performing the wire-bonding. The crack 16 may destroy the transistor cell 14, causing the IC chip to be inadequate.

SUMMARY OF THE INVENTION

The present invention has been made in view of such problems, and its object is to provide a semiconductor device which can not only suppress an occurrence of an alloy spike but also prevent fine-grained silicon separated on an interlayer insulation film from causing an IC chip to be inadequate at the time of wire-bonding. Another object of the present invention is to provide a method of manufacturing such a semiconductor device.

In order to attain such an object, the semiconductor device according to the present invention adopts an electrode of which a main component is aluminum and which contains fine-grained silicon of 0.1 to 0.6 weight % as an electrode interposed between an interlayer insulation film and a wire. As a result, even if a large ultrasonic power, large load or the like is applied to the electrode for the wire to be wire-bonded when the wire is wire-bonded, such power or the like is not directly transmitted to the interlayer insulation film disposed therebelow. Therefore, damage such as a crack hardly generates at the interlayer insulation film. As a result, in a device such as an IC chip provided with the electrode described above, the occurrence of defects due to the wire-bonding can be reduced and the occurrence of the alloy spike can be suppressed.

In the method of manufacturing the semiconductor device according to the present invention, an electrode is vapor-deposited on an interlayer insulation film by using an Al—Si alloy target containing fine-grained silicon of 0.1 to 0.6 weight %, which is a raw material for the electrode.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

PREFERRED EMBODIMENTS OF THE INVENTION

The present invention will be described based on preferred embodiments.

Figure 1:
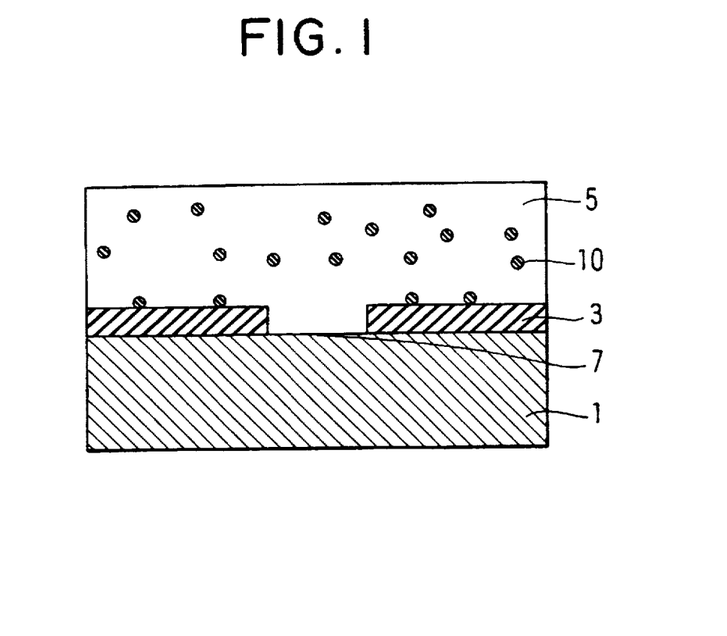
FIG. 1 is a partly sectional schematic view of a semiconductor device according to a first embodiment of the present invention.

FIG. 1 is a partly sectional schematic view of a semiconductor device illustrating a state of occurrence of fine-grained silicon in an electrode for a wire to be wire-bonded.

In FIG. 1, elements such as transistors, resistors and capacitors (not shown) are formed inside or at the upper part of a silicon substrate 1 as a well-known power MOSFET or IGBT. On the silicon substrate 1, an interlayer insulation film 3 is formed by a CVD method or the like. The interlayer insulation film 3 is composed of, for example, a Boron-Phosphorus Silicate Glass (BPSG) film or Phosphorus Silicate Glass (PSG) film. An electrode 5 which is a thin film of an Al—Si alloy is vapor-deposited on the interlayer insulation film 3 by a sputtering method. A wire (not shown) is wire-bonded to the electrode 5.

The sputtering conditions include a power of 7.2 kw, a gas pressure of 6 mTorr, and a substrate heating temperature of 150° C. As a target which is a raw material for the electrode 5, an Al—Si alloy containing fine grained silicon of 0.5 weight % is used. The substrate 1 is heated by spraying on a back surface of the substrate 1 Ar gas heated by a heater installed in a stage chucking the substrate 1. In the heating of the substrate 1, the temperature of the substrate 1 is controlled by the amount of current flowing through the heater.

Thereafter, the electrode 5 is formed into a predetermined pattern by performing a photo-etching step. Following this photo-etching step, the semiconductor device is subject to sintering at a temperature of 450° C. for 30 minutes. The silicon substrate 1 is electrically connected to the electrode 5 with good conductivity due to the sintering.

The semiconductor device thus obtained has the electrode 5 of which a main component is aluminum and in which fine grained silicon having an average grain diameter of 1 μm are contained in a concentration of 0.5 weight %.

In this embodiment, by lowering the silicon content ratio of the electrode 5, the occurrence of the defective semiconductor device can be suppressed and the occurrence of an alloy spike can be prevented.

It is preferable that an amount of fine-grained silicon contained in the electrode 5 is in a range of 0.1 to 0.6 weight %. The reason why the range of 0.1 to 0.6 weight % is preferable is described in detail below.

Figure 22:
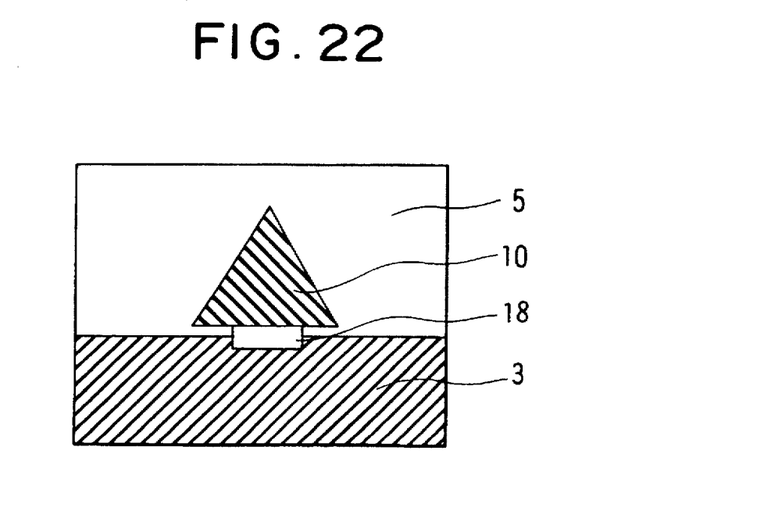
FIG. 22 is a schematic view to explain a cause of the problem that occurs in the conventional semiconductor device.

The inventors found a crack occurring mechanism in the interlayer insulation film 3 through a close study with respect to the electrode containing fine-grained silicon. That is, as shown in FIG. 22, if fine-grained silicon separates on the interlayer insulation film 3, there arises a possibility that a reactive junction layer 18 generates at the interface of the fine-grained silicon 10 and the interlayer insulation film 3. The reactive junction layer 18 is the oxide of silicon because silicon separated from the electrode 5 reacts with oxygen in the interlayer insulation film 3.

Figure 2:
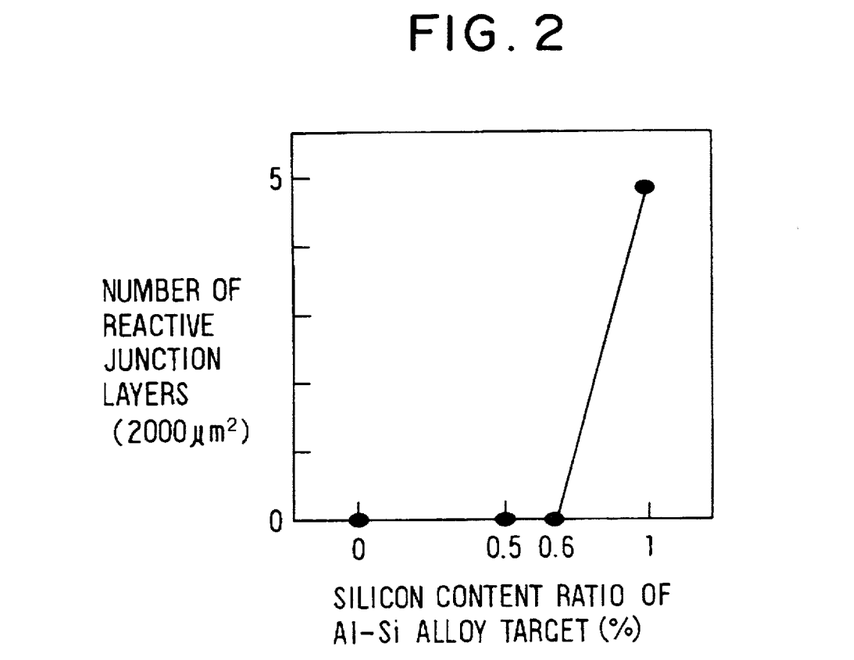
FIG. 2 is a graph showing a relationship between a silicon content ratio and a number of reactive junction layers.

FIG. 2 shows a relationship between a silicon content ratio of the Al—Si alloy target and the number of reactive junction layers 18 generated between the interlayer insulation film 3 and the fine-grained silicon 10 separated thereon. The number of the reactive junction layers 18 generated between the interlayer insulation film 3 and the fine-grained silicon 10 was determined based on a number of depressions (/2000 μm$^2$) caused by the fine-grained silicon 10. The number of the depressions is detected by observing a surface of the interlayer insulation film 3 with an SEM or the like, after the electrode 5 is removed by wet-etching with hydrochloric acid or the like and the fine-grained silicon 10 is completely removed by ultrasonic washing.

When the interface between the fine-grained silicon 10 and the interlayer insulation film 3 was watched in a sample that became inadequate due to the performance of a wire-bonding step, it was observed that reactive junction layers 18 shown in FIG. 21 were generated at the interface therebetween. Therefore, if reactive junction layers 18 are generated, when the fine-grained silicon is removed along with the reactive junction layers 18 by the ultrasonic washing, the depressions are left on the surface of the interlayer insulation film 18. Consequently, the number of the reactive junction layers 18 can be determined based on the number of the depressions.

It is understood from FIG. 2 that the number of the reactive junction layers 18 generating between the interlayer insulation film 3 and the fine-grained silicon 10 separated thereon can be reduced when the silicon content ratio of the Al—Si alloy target is equal to or less than 0.6 weight %.

Figure 3:
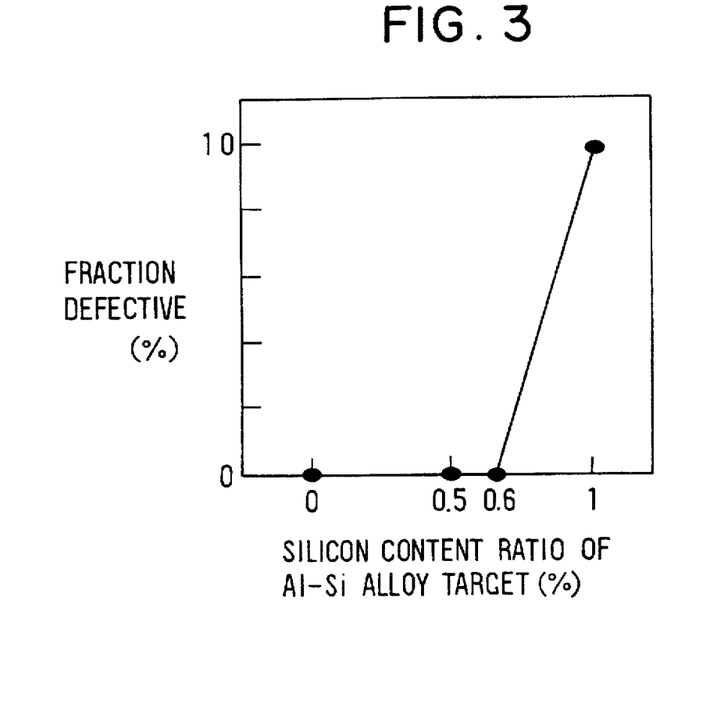
FIG. 3 is a graph showing a relationship between the silicon content ratio and a fraction defective.

FIG. 3 is a graph showing a relationship between the silicon content ratio of the Al—Si alloy target and a fraction defective in a case where six aluminum wires are wire-bonded to the electrode 5 under conditions that included an aluminum wire diameter of 400 μm, load of 500 to 600 gf, and ultrasonic power of 90 to 110.

It is understood from FIG. 3 that the fraction defective can be greatly reduced when the silicon content ratio of the Al—Si alloy target is equal to or less than 0.6 weight %.

That is, it is apparent from FIGS. 2 and 3 that if the number of the reactive junction layers 18 is reduced, the fraction defective is also reduced. The reduction in number of the reactive junction layers can be achieved by using the Al—Si alloy target having the silicon content ratio of 0.6 weight % or less.

Further, when a depth of an alloy spike was measured in a case where Al—Si alloy having the silicon content ratio of 0.5 weight % was used as the electrode 5, the depth of the alloy spike was in a range of 0.2 to 0.5 μm. The alloy spike depth of 0.2 to 0.5 μm does not affect the performance of the semiconductor device such as a power MOSFET.

It is to be noted that the silicon content ratio of the Al—Si alloy target has a correlation with the component of the electrode 5. For example, it has been observed that when the Al—Si alloy target having silicon content ratio of 0.5 weight % is used, the electrode 5 obtained from the Al—Si alloy target contains silicon of 0.5 weight % as well.

In this embodiment, the electrode 5 is formed from the target in which the silicon content ratio of the Al—Si alloy is accurately adjusted between 0.1 to 0.6 weight %. That is, silicon contained in the target is in extremely small quantity. Therefore, the fine-grained silicon generated in forming the electrode 5 as a thin film is also very small and is distributed uniformly among the thin film. Further, the fine-grained silicon dissolve in the thin film to its solution limit in a heat treatment performed thereafter. When the fine-grained silicon reseparates in the thin film in a cooling process, because silicon contained in the electrode 5 is limited to a small quantity, i.e. the silicon content ratio is in the range of 0.1 to 0.6 weight %, growing cores of the fine-grained silicon are in small amounts on the interlayer insulation layer 3. Therefore, the growing of the fine-grained silicon is retarded on the interlayer insulation film 3. As a result, since the stress generating between the fine-grained silicon 10 and the interlayer insulation film 3 is small, the reactive junction layer 18 is hardly generated in the interface thereof.

Consequently, even if the fine-grained silicon separates in the thin film of the Al—Si alloy, since the reactive junction layer is hardly formed at the interface of the fine-grained silicon and the interlayer insulation film, the occurrence of the crack in the interlayer insulation film can be remarkably reduced in performing the wire-bonding.

Because silicon of 0.1 weight % at the least is contained in the electrode 5, it is possible to prevent silicon from dissolving in the electrode 5 from the silicon substrate. As a result, the occurrence of alloy spikes can be suppressed.

In view of all of the above, according to this embodiment, it is possible to prevent the wire-bonding step from causing the semiconductor device to be inadequate. At the same time, the quality of the semiconductor device can be improved.

Although the wire-bonding is performed on the thin film of the Al—Si alloy in the first embodiment, the present invention can be applied to a device in which bumps or the like disposed below the Al—Si alloy film are subject to ultrasonic power or loads therethrough. In this case, the damage of the bedding such as a bump can be relieved.

It is to be noted that the fine-grained silicon having an average grain diameter of 1 μm is used in the first embodiment, but the fine-grained silicon having an average grain diameter of 0.1 to 3.5 μm can be used to achieve the same function and the same result as the first embodiment.

Next, the second embodiment of the present invention will be described with reference to the drawings.

Figure 4:
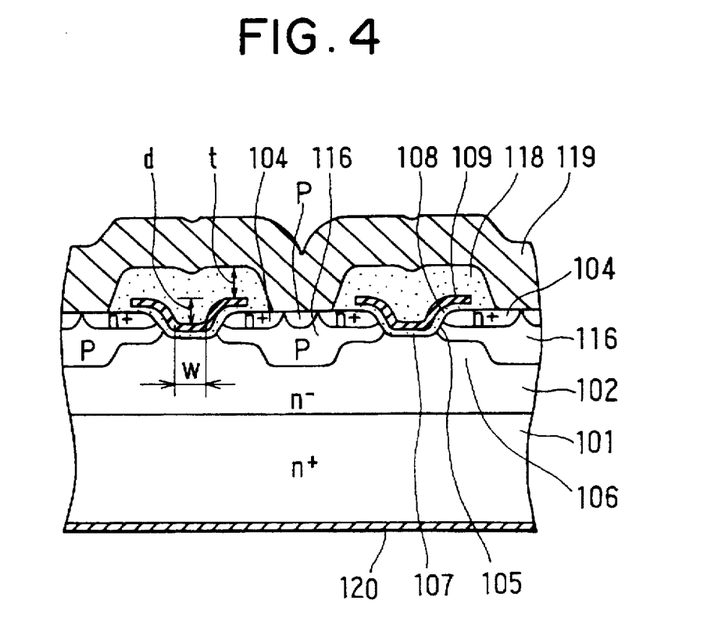
FIG. 4 is a partly sectional view of a concave-type power MOSFET according to a second embodiment of the present invention.

FIG. 4 is a partly sectional view of a concave-type power MOSFET according to the second embodiment.

In the second embodiment, a source electrode 119 contains silicon of 0.4 weight %, and an interlayer insulation layer 118 is formed so that the thickness t of the interlayer insulation film 118 and the width w of the inside bottom surface of the concave portion of the gate electrode 109 satisfy the relationship of w≦2 t. As a result, the flatness of the surface of the interlayer insulation film 118 can be improved irrespective of a depth d of a groove in which the gate electrode 109 is formed. Although not shown in FIG. 4, the source electrode 119 is coated with a protective layer.

Figure 5:
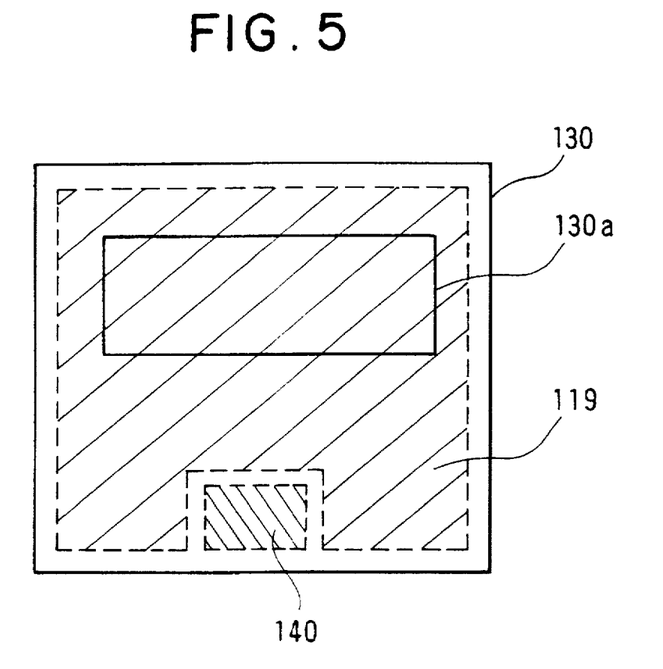
FIG. 5 is a plan view of the concave-type power MOSFET shown in FIG. 4.

FIG. 5 is a plan view of the concave-type power MOSFET shown in FIG. 4. The protective layer 130 having an opening 130a is formed on the source electrode 119 which covers a plurality of cells. A wire-bonding is performed to the source electrode 119 through the opening 130a. A numeral 140 denotes a gate electrode pad.

Next, the method of manufacturing the concave-type power MOSFET will be described.

Figure 6:
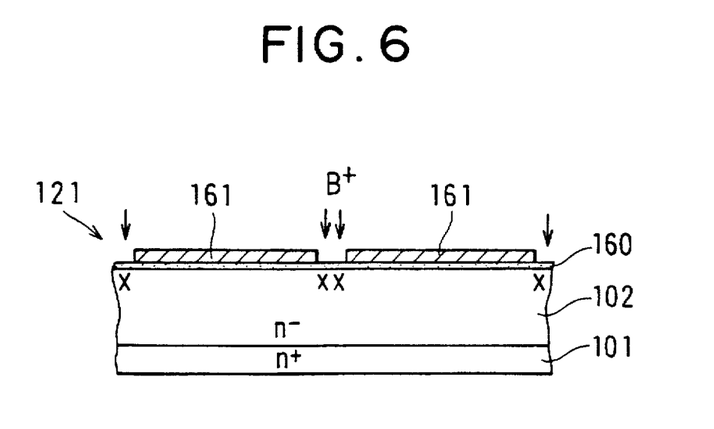
FIG. 6 is a partly sectional view showing a first step of manufacturing the concave-type power MOSFET.

First, as shown in FIG. 6, a wafer 121 is prepared. In the wafer 121, an n⁻-type epitaxial layer 102 has been developed on a main surface of a semiconductor substrate 101 made of n⁺-type silicon. A field oxide film 160 is formed by thermally oxidizing the main surface of the wafer 121, and then, a resist film 161 is deposited on the wafer 121. The resist film 161 is patterned by a well-known photo-lithography technique so that openings are formed at a position for the cells to be formed. Boron ions (B⁺) are implanted into the epitaxial layer 102 by using the resist film 161 as a mask.

Figure 7:
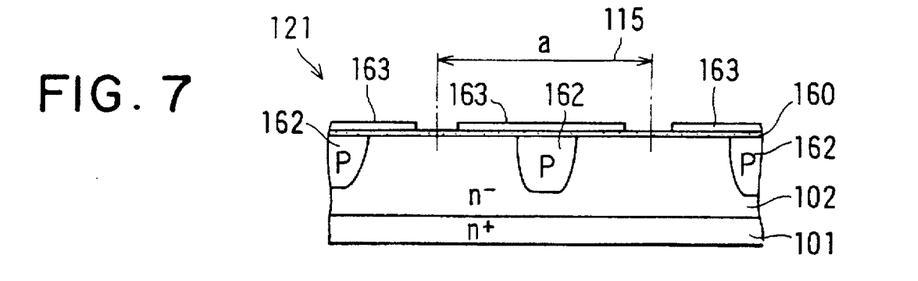
FIG. 7 is a partly sectional view showing a second step of manufacturing the concave-type power MOSFET, which follows the first step of FIG. 6.

After the resist film 161 is removed, as shown in FIG. 7, a p-type diffusion layer 162 is formed by thermal diffusion. A junction depth of the diffusion layer 162 is approximately 3 μm. Next, a silicon nitride film 163 is deposited to a thickness of about 200 nm on the main surface of the wafer 121 by a CVD method. By patterning the silicon nitride film 163, a lattice-like open pattern in which openings are formed at pitches of "a" (a size of the cell 115) is formed on the silicon nitride film 163. It is to be noted that mask alignment is applied to the open pattern so that the p-type diffusion layer 162 is positioned in a central part of the pitch "a".

Figure 8:
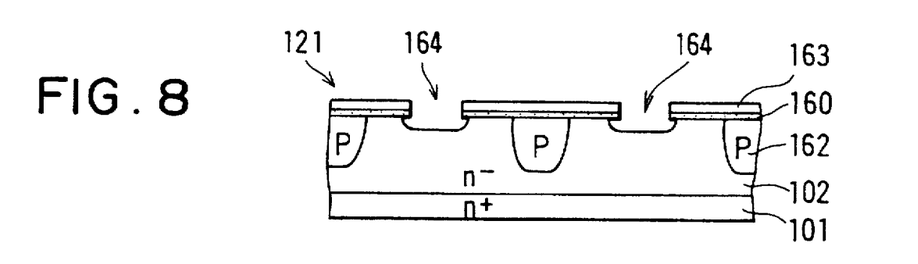
FIG. 8 is a partly sectional view showing a third step of manufacturing the concave-type power MOSFET, which follows the second step of FIG. 7.

Following the above, as shown in FIG. 8, the field oxide film 160 is etched by using the silicon nitride film 163 as a mask. Thereafter, grooves 164 are formed by etching the n⁻-type epitaxial layer 102 to a depth of approximately 1.5 μm.

Figure 9:
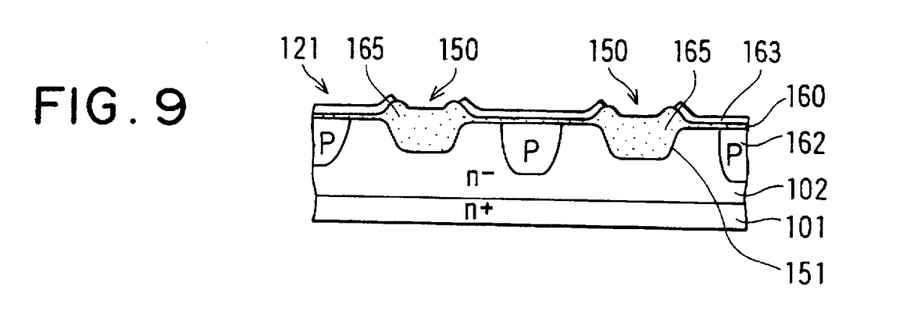
FIG. 9 is a partly sectional view showing a fourth step of manufacturing the concave-type power MOSFET, which follows the third step of FIG. 8.

As shown in FIG. 9, the grooves 164 are thermally oxidized by using the silicon nitride film 163 as a mask. This is a oxidizing method which is well-known as a LOCOS (local oxidation of silicon). Selective oxide films 165 are formed by this oxidation. At the same time, U-grooves 150 are formed on the surface of the n⁻-type epitaxial layer 102 eroded by the selective oxide films 165.

Figure 10:
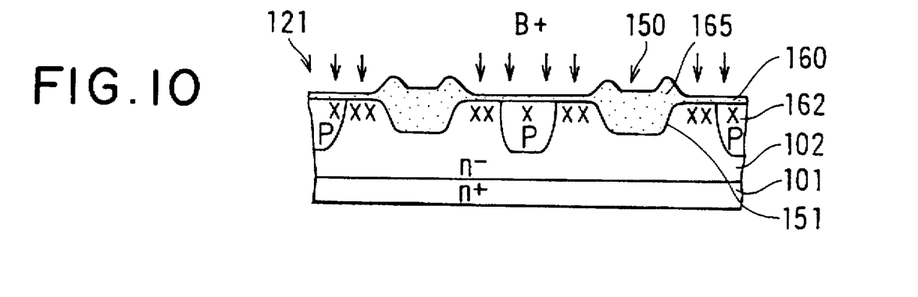
FIG. 10 is a partly sectional view showing a fifth step of manufacturing the concave-type power MOSFET, which follows the fourth step of FIG. 9.

Then, as illustrated in FIG. 10, the silicon nitride film 163 is removed by wet-etching. In the wet-etching, the silicon nitride film 163 is immersed in, for example, heated phosphoric acid. Boron ions are implanted through the thin field oxide film 160 by using the selective oxide films 165 as a mask to form a p-type base layer 116. In this process, the boundary face between the selective oxide film 165 and the field oxide film 160 is coincided with a self-alignment position, and accordingly a region into which the boron ions are to be implanted can exactly be defined.

Figure 11:
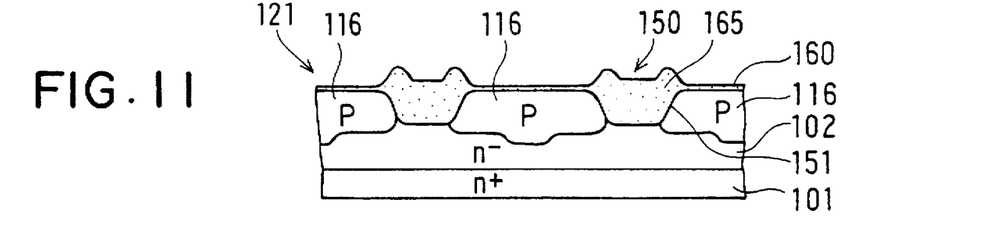
FIG. 11 is a partly sectional view showing a sixth step of manufacturing the concave-type power MOSFET, which follows the fifth step of FIG. 10.

Next, as illustrated in FIG. 11, thermal diffusion is performed to obtain a junction depth of approximately 3 μm with respect to the boron ions. By this thermal diffusion, the p-type diffusion layer 162 previously formed in the process illustrated in FIG. 7 and the diffusion layer of the boron ions implanted in the process illustrated in FIG. 10 are integrated into a single p-type base layer 116. Both end surfaces of the p-type base layer 116 are self-alignedly defined in the position of the side walls of the U-groove 150.

Figure 12:
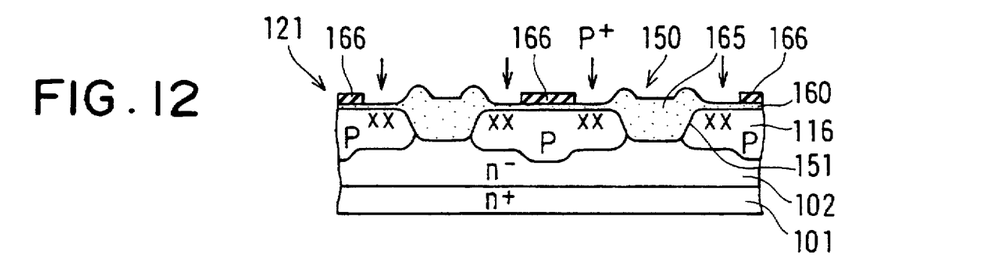
FIG. 12 is a partly sectional view showing a seventh step of manufacturing the concave-type power MOSFET, which follows the sixth step of FIG. 11.

Now, as illustrated in FIG. 12, phosphorous ions are implanted through the thin field oxide film 160 by using both resist films 166 patterned in a pattern in which the resist film 166 is left on the central part of the surface of the p-type base layer 116 surrounded by the selective oxide films 165 and the selective oxide films 165 as a mask to form a n⁺-type source layer 104. In this process, the boundary face between the selective oxide film 165 and the field oxide film 160 is coincided with a self-alignment position in the same manner as the process illustrated in FIG. 10, in which boron ions were implanted. Accordingly, a region into which the phosphorous ions are to be implanted can exactly be defined.

Figure 13:
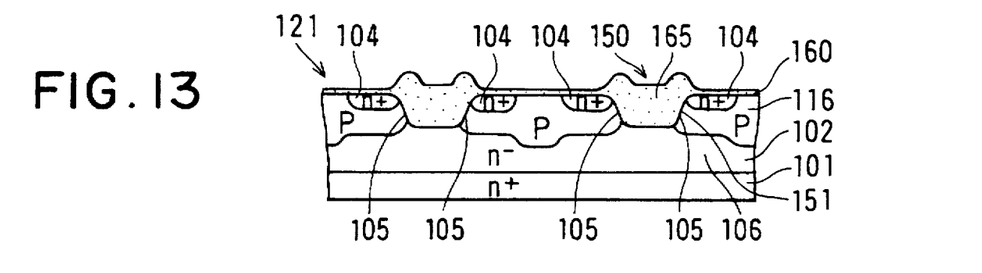
FIG. 13 is a partly sectional view showing a eighth step of manufacturing the concave-type power MOSFET, which follows the seventh step of FIG. 12.

After the above, as illustrated in FIG. 13, the phosphorous ions are diffused to a junction depth of 0.5 to 1 μm. As a result, the n⁺-type source layer 104 is formed and concurrently a channel 105 is set up. In this thermal diffusion, the end surface being in contact with the U-groove 150 in the region of the n+-type source layer 104 is self-alignedly defined at the position of the side wall of the U-groove 150.

Figure 14:
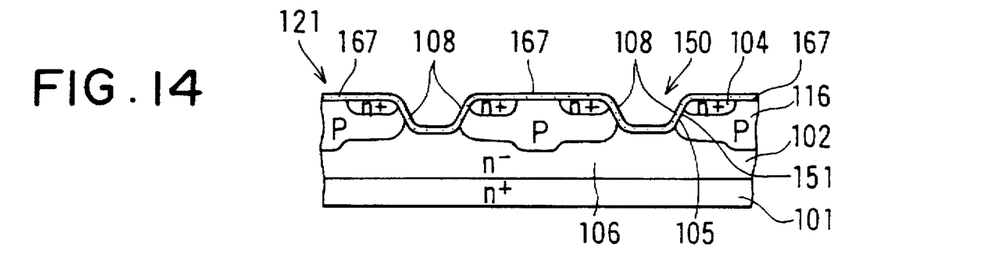
FIG. 14 is a partly sectional view showing a ninth step of manufacturing the concave-type power MOSFET, which follows the eighth step of FIG. 13.

As illustrated in FIG. 14, the selective oxide films 165 are removed by wet-etching to expose an inside wall 151 of the U-groove 151. Then, a gate oxide film 108 is formed to a thickness of approximately 60 nm by thermal oxidation.

Figure 15:
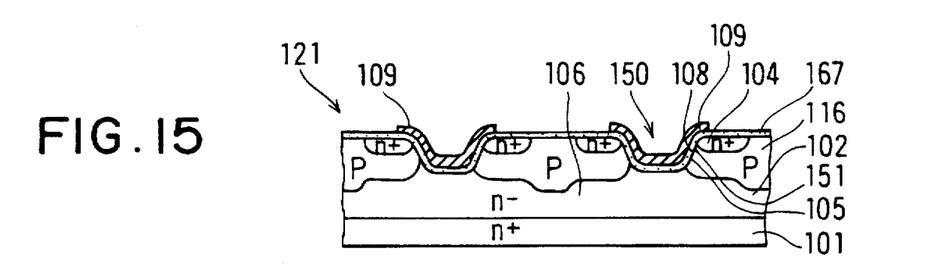
FIG. 15 is a partly sectional view showing a tenth step of manufacturing the concave-type power MOSFET, which follows the ninth step of FIG. 14.

Next, as illustrated in FIG. 15, a polysilicon film is deposited to a thickness of approximately 400 nm on the main surface of the wafer 121 by the CVD method. After that, gate electrodes 109 are formed by patterning the polysilicon film on the main surface of the wafer 121.

Figure 16:
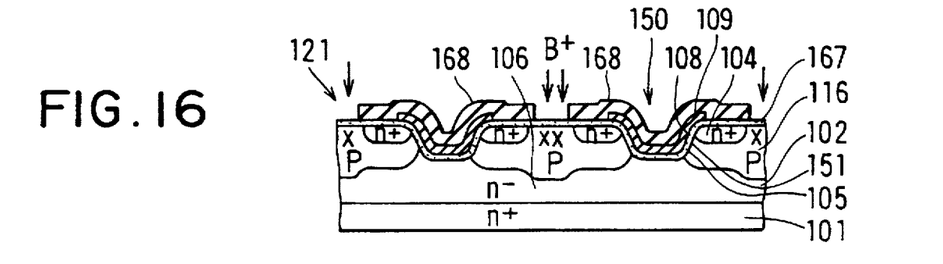
FIG. 16 is a partly sectional view showing a eleventh step of manufacturing the concave-type power MOSFET, which follows the tenth step of FIG. 15.

Following the above, as illustrated in FIG. 16, boron ions are implanted through the oxide film 167 by using the patterned resist films 168 as a mask in preparation for forming a p⁺-type base contact layer 117.

Figure 17:
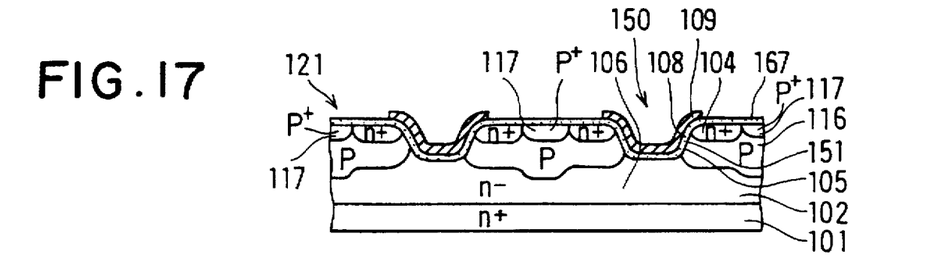
FIG. 17 is a partly sectional view showing a twelfth step of manufacturing the concave-type power MOSFET, which follows the eleventh step of FIG. 16.

Then, as illustrated in FIG. 17, the p⁺-type base contact layer 117 is formed to a junction depth of approximately 0.5 μm by thermal diffusion.

Subsequently, an interlayer insulation film 118 is formed with BPSG on the main surface of the wafer 121 by the CVD method. At this time, the thickness t of the interlayer insulation film 118 is set to be equal to or greater than the half of the width w of the inside bottom surface of the concave portion of the gate electrode 109. In the second embodiment, both the thickness t and the width w are set to 1.5 μm.

After the above, the p⁺-type base contact layer 117 and n⁺-type source layer 104 are exposed by forming contact holes in the interlayer insulation layer 118 and the gate oxide film 108. Further, the source electrode 119 is formed with an Al—Si alloy film to achieve an ohmic contact between the source electrode 119 and, the p⁺-type base contact layer 117 and n⁺-type source layer 104 through the contact holes. In addition, a passivation film for protecting the Al—Si alloy film is formed with silicon nitride by a plasma CVD method or the like and then, as illustrated in FIG. 5, the opening 130a is formed for wire-bonding.

On the back surface of the wafer 121, a drain electrode 120 is formed and ohmically contacted with the n⁺-type semiconductor substrate 101.

Subsequently, the wire-bonding is performed by bonding a wire on the source electrode 119 at the opening 130a and then the opening 130a is sealed with resin.

Figure 18A:
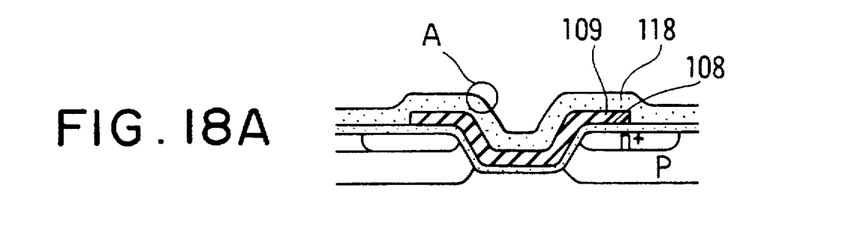
FIGS. 18A to 18C are partly sectional views showing the relationship between the thickness of an interlayer insulation film and its flatness.

While the interlayer insulation film 118 is formed by the CVD method, the thickness of the interlayer insulation film 118 increases uniformly on the U-groove 150. In this case, if the thickness of the interlayer insulation film 118 is thin, as illustrated in FIG. 18A, a stepped portion is left on the interlayer insulation film 118 due to the stepped portion of the U-groove 150.

Figure 18B:
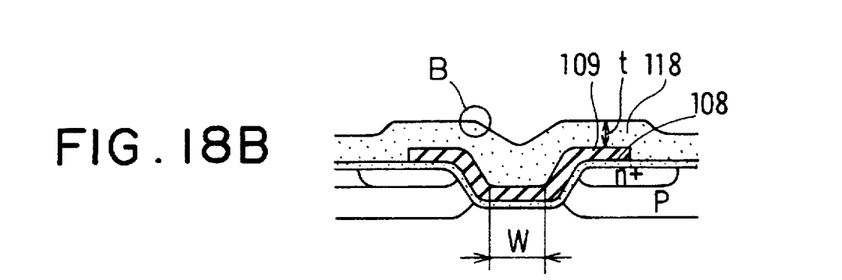
Figure 18C:
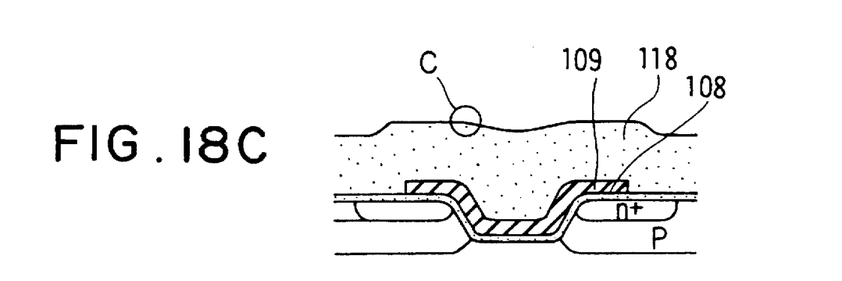

On the other hand, when the thickness of the interlayer insulation film 118 is thick, i.e., the thickness t of the interlayer insulation film 118 is equal to or greater than the half of the width w of the inside bottom surface of the concave portion of the gate electrode 109, as illustrated in FIG. 18B, the interlayer insulation film 118 grows laterally from inclined faces opposite to each other of the gate electrode 109. The portions of the interlayer insulation film 118 growing laterally from the inclined faces overlap with each other and thereby minimizes the stepped portion thereof. Moreover, if the thickness of the interlayer insulation film 118 is thicker, i.e., the thickness t is equal to the width w, as illustrated in FIG. 18C, it is possible to substantially flatten the surface of the interlayer insulation film 118.

As a result, the flatness of the source electrode 119 is improved over the U-groove 150. A contact area of the source electrode 119 and the wire is enlarged in performing the wire-bonding. Therefore, bonding strength between the source electrode 119 and the wire is increased and resistance in the device can be reduced. Furthermore, local concentrations of the ultrasonic power or loads applied to the source electrode 119 can be prevented. Therefore the destruction of the device can be avoided.

It is to be noted that a material such as silicon dioxide containing boron and phosphorus which has the property prone to soften by thermal treatment can be used as the interlayer insulation film 118. In this case, the thermal treatment is performed after the formation of the interlayer insulation film 118 to smooth the surface of the interlayer insulation film 118. As a result, the surface of the source electrode 119 can be flatted further.

In addition, after the formation of the interlayer insulation film 118, chemical or mechanical grinding may be performed to the surface of the interlayer insulation film 118 to flatten the surface thereof.

The present invention is be limited to the lattice-like pattern described in the second embodiment but a stripe-like pattern may also be used.

Further, the present invention is not limited to a vertical type MOSFET described in the second embodiment but may also be applied to a power MOSIC with an incorporation of a vertical type MOSFET or an IGBT. Such a semiconductor device can be made into an n-channel type or P-channel type.

In the second embodiment, description has been given only to the vertical type power MOSFET. However, the present invention has the same effect in a lateral type power MOSFET. In this case, the drain electrode is formed on the main surface of the semiconductor substrate 1.

What is claimed is:

1. A semiconductor device comprising:
    a semiconductor substrate in which an element is formed;
    an insulation film provided on said semiconductor substrate;
    an electrode provided on said insulation film so as to be connected to said element, said electrode consisting of aluminum as a main component and fine-grained silicon, said electrode having a silicon concentration of from 0.1 wt % to 0.5 wt %; and
    a wire bonded to said electrode.

2. A semiconductor device according to claim 1, wherein said semiconductor substrate is composed of silicon.

3. A semiconductor device according to claim 1, wherein said fine-grained silicon has an average grain diameter of 0.1 μm to 3.5 μm.

4. A semiconductor device according to claim 1, wherein a depth of an alloy spike formed in the semiconductor substrate is in a range of 0.2 μm to 0.5 μm.

5. A semiconductor device according to claim 1, wherein said element has an MOS structure and said semiconductor substrate has a first surface with a groove formed therein of a first conductivity type, said MOS structure comprising:

a base region of a second conductivity type formed in a surface portion of said semiconductor substrate to face a side wall of said groove;

a source region of the first conductivity type formed in a portion of said base region so as to form a channel in said base region facing said side wall of said groove;

a gate insulation film formed on said groove;

a gate electrode having a concave shape and formed on said gate insulation film; and a drain electrode formed on a second surface of said semiconductor substrate, wherein said insulation film is formed on said semiconductor substrate to cover said gate electrode, wherein said electrode is formed on said insulation film and said semiconductor substrate to make contact with said base region and said source region, and wherein a width of an inner bottom surface of said gate electrode w and a thickness of said insulation film t satisfy a relationship $W \leq 2t$.

6. A semiconductor device according to claim 1, wherein said element formed in said semiconductor substrate is a power transistor in which current flows in a vertical direction thereof during operation.

7. A semiconductor device according to claim 1, wherein said element formed in said semiconductor substrate has a p-conductivity type region and an n-conductivity type region, both of which are exposed on a surface of said semiconductor substrate and in contact with said electrode.

8. A semiconductor device comprising:

a semiconductor substrate in which an element is formed, said element having a p-conductivity type region and an n-conductivity type region, both of which are exposed on a surface of said semiconductor substrate;

an insulation film provided on said semiconductor substrate;

an electrode provided on said insulation film so as to be connected to said element, said electrode consisting of aluminum as a main component and fine-grained silicon, said fine-grained silicon being present in a concentration of 0.1 wt % to 0.5 wt % so that a depth of an alloy spike formed in the semiconductor substrate due to said electrode is in a range of from 0.2 μm to 0.5 μm; and a wire bonded to said electrode.

9. A semiconductor device according to claim 8, wherein said fine-grained silicon has an average grain diameter of from 0.1 μm to 3.5 μm.

10. A semiconductor device according to claim 8, wherein said element has an MOS structure and said semiconductor substrate has a first surface with a groove formed therein of a first conductivity type, said MOS structure comprising:

a base region of a second conductivity type formed in a surface portion of said semiconductor substrate to face a side wall of said groove;

a source region of the first conductivity type formed in a portion of said base region so as to form a channel in said base region facing said side wall of said groove;

a gate insulation film formed on said groove;

a gate electrode having a concave shape and formed on said gate insulation film; and a drain electrode formed on a second surface of said semiconductor substrate, wherein said insulation film is formed on said semiconductor substrate to cover said gate electrode, wherein said electrode is formed on said insulation film and said semiconductor substrate to make contact with said base region and said source region, and wherein a width of an inner bottom surface of said gate electrode w and a thickness of said insulation film t satisfy a relationship $W \leq 2t$.

* * * * *